(12) United States Patent
Wang et al.

(10) Patent No.: US 11,120,762 B2
(45) Date of Patent: Sep. 14, 2021

(54) GATE DRIVING UNIT, METHOD FOR DRIVING THE SAME, GATE DRIVING CIRCUITRY AND DISPLAY MODULE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Zhangmeng Wang, Beijing (CN); Yimin Chen, Beijing (CN); Xianjie Shao, Beijing (CN)

(73) Assignees: HEFEI BOE OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 61 days.

(21) Appl. No.: 16/469,530

(22) PCT Filed: Sep. 10, 2018

(86) PCT No.: PCT/CN2018/104827
§ 371 (c)(1),
(2) Date: Jun. 13, 2019

(87) PCT Pub. No.: WO2019/144627
PCT Pub. Date: Aug. 1, 2019

(65) Prior Publication Data
US 2020/0380931 A1  Dec. 3, 2020

(30) Foreign Application Priority Data

Jan. 29, 2018  (CN) .......................... 201810083879.9

(51) Int. Cl.
*G09G 3/36* (2006.01)
*G11C 19/28* (2006.01)

(52) U.S. Cl.
CPC ... *G09G 3/3677* (2013.01); *G09G 2310/0286* (2013.01); *G09G 2310/0291* (2013.01);
(Continued)

(58) Field of Classification Search
CPC ............. G09G 3/3677; G09G 2330/08; G09G 2310/0291; G09G 2310/08; G09G 2310/0286; G11C 19/28
See application file for complete search history.

(56) References Cited

U.S. PATENT DOCUMENTS 8,106,874 B2  1/2012  Chiang et al.
9,305,498 B2  4/2016  Wang
(Continued)

FOREIGN PATENT DOCUMENTS

CN  101335050 A  12/2008
CN  101359511 A  2/2009
(Continued)

OTHER PUBLICATIONS

Office Action, including Search Report, for Chinese Patent Application No. 201810083879.9, dated Nov. 26, 2019, 12 pages.
(Continued)

*Primary Examiner* — Mark W Regn
(74) *Attorney, Agent, or Firm* — Westman, Champlin & Koehler, P.A.

(57) ABSTRACT

A gate driving unit, a method for driving the same, a gate driving circuitry and a display module are provided. The gate driving unit includes: a shift register circuit configured to delay a phase of an input signal inputted by a signal input end under control of a first clock signal input end and a second clock signal input end to obtain a carry signal, and output the carry signal through a carry end; and a pulse width regulation circuit configured to regulate a pulse width of the carry signal under control of the enable end to obtain
(Continued)

a gate drive signal, and output the gate drive signal through a gate drive signal output end.

18 Claims, 6 Drawing Sheets

(52) U.S. Cl.
CPC ..... *G09G 2310/08* (2013.01); *G09G 2330/08* (2013.01); *G11C 19/28* (2013.01)

(56) References Cited

U.S. PATENT DOCUMENTS

| | | | |
|---|---|---|---|
| 10,241,145 | B2 | 3/2019 | Zhang et al. |
| 2008/0043006 | A1* | 2/2008 | Wei .......................... G09G 3/20 345/205 |
| 2009/0033642 | A1 | 2/2009 | Chiang et al. |
| 2009/0085899 | A1* | 4/2009 | Ando ..................... G09G 3/296 345/205 |
| 2015/0248867 | A1* | 9/2015 | Tan ........................ G11C 19/28 345/100 |
| 2015/0325181 | A1 | 11/2015 | Wang |
| 2017/0193891 | A1* | 7/2017 | Park ..................... G11C 19/287 |
| 2018/0080973 | A1 | 3/2018 | Zhang et al. |

FOREIGN PATENT DOCUMENTS

| | | |
|---|---|---|
| CN | 101399002 A | 4/2009 |
| CN | 104157248 A | 11/2014 |
| CN | 104183210 A | 12/2014 |
| CN | 105590607 A | 5/2016 |
| CN | 106205518 A | 12/2016 |
| JP | H05-18877 A | 1/1993 |

OTHER PUBLICATIONS

International Search Report and Written Opinion, including English translation of Box V of the Written Opinion, for International Application No. PCT/CN2018/104827, dated Dec. 12, 2018, 12 pages.

* cited by examiner

GATE DRIVING UNIT, METHOD FOR DRIVING THE SAME, GATE DRIVING CIRCUITRY AND DISPLAY MODULE

CROSS-REFERENCE TO RELATED APPLICATION

The present application is the U.S. national phase of PCT Application No. PCT/CN2018/104827 filed on Sep. 10, 2018, which claims a priority of the Chinese Patent Application No. 201810083879.9 filed on Jan. 29, 2018, which are incorporated herein by reference in their entirety.

TECHNICAL FIELD

The present disclosure relates to the field of display driving technologies, in particular to a gate driving unit, a method for driving the same, a gate driving circuitry and a display module.

BACKGROUND

With the development of liquid crystal display (LCD) technology, wearable devices such as smart watches and health monitors are becoming more and more popular, and display panel designs for the wearable devices are gradually emerging. Since a panel of the wearable device has a small size, the production process and the production cost of the display panel may be increased if a chip is used to drive its gate electrode, and a narrow bezel design cannot be realized. Therefore, it is urgent to design a novel gate driving method, and a gate driving circuitry of the display panel by fabricating an integrated circuit including a thin film transistor (TFT) on a glass substrate.

The display panel of the wearable device is generally small in size, and the size of its gate driving circuitry is correspondingly small. Therefore, it is necessary to design a driving circuitry with excellent performance in a limited space to ensure normal operation of the display panel. The existing gate driving circuitry applied to the panel of the wearable device has a complicated structure and a large number of transistors, which is disadvantageous for achieving a narrow bezel and low power consumption.

SUMMARY

In a first aspect, a gate driving unit is provided according to embodiments of the present disclosure. The gate driving unit includes:

a shift register circuit, connected to a signal input end, a first clock signal input end, a second clock signal input end and a carry end, and configured to delay a phase of an input signal inputted by the signal input end under control of the first clock signal input end and the second clock signal input end to obtain a carry signal, and output the carry signal through the carry end; and a pulse width regulation circuit, connected to the carry end, an enable end and a gate drive signal output end, and configured to regulate a pulse width of the carry signal under control of the enable end to obtain a gate drive signal, and output the gate drive signal through the gate drive signal output end.

According to some feasible embodiments of the present disclosure, the gate driving unit further includes a buffer circuit. The buffer circuit is connected between the pulse width regulation circuit and the gate drive signal output end, and is configured to buffer the gate drive signal to filter a glitch signal out of the gate drive signal to obtain the buffered gate drive signal, and output the buffered gate drive signal through the gate drive signal output end.

According to some feasible embodiments of the present disclosure, the shift register circuit comprises a first NAND gate, a first transmission gate, a phase inverter, a second NAND gate, and a second transmission gate. A first input end of the first NAND gate is connected to the signal input end, and a second input end of the first NAND gate is connected to the second clock signal input end. A positive phase control end of the first transmission gate is connected to the second clock signal input end, an inverted phase control end of the first transmission gate is connected to the first clock signal input end, and an input end of the first transmission gate is connected to an output end of the first NAND gate. An input end of the phase inverter is connected to an output end of the first transmission gate, and an output end of the phase inverter is connected to the carry end. A first input end of the second NAND gate is connected to the first clock signal input end, and a second input end of the second NAND gate is connected to the carry end. A positive phase control end of the second transmission gate is connected to the first clock signal input end, an inverted phase control end of the second transmission gate is connected to the second clock signal input end, an input end of the second transmission gate is connected to the output end of the second NAND gate, and an output end of the second transmission gate is connected to the input end of the phase inverter.

According to some feasible embodiments of the present disclosure, each of the first NAND gate, the first transmission gate, the phase inverter, the second NAND gate, and the second transmission gate consists of an N-type transistor and a P-type transistor.

According to some feasible embodiments of the present disclosure, the pulse width regulation circuit comprises an AND gate, a first input end of the AND gate is connected to the carry end, a second input end of the AND gate is connected to the enable end, and an output end of the AND gate is connected to the gate drive signal output end through the buffer circuit.

According to some feasible embodiments of the present disclosure, the AND gate consists of an N-type transistor and a P-type transistor.

According to some feasible embodiments of the present disclosure, the buffer circuit comprises a buffer having an input end connected to the output end of the AND gate, and an output end connected to the gate drive signal output end.

According to some feasible embodiments of the present disclosure, the buffer consists of an N-type transistor and a P-type transistor.

In a second aspect, a method for driving a gate driving unit is further provided according to embodiments of the present disclosure, which is used to drive the above gate driving unit. The method for driving a gate driving unit includes:

delaying, by the shift register circuit, the phase of the input signal inputted by the signal input end under control of the first clock signal input end and the second clock signal input end to obtain the carry signal, and outputting the carry signal through the carry end; and regulating, by the pulse width regulation circuit, the pulse width of the carry signal under control of the enable end to obtain the gate drive signal, and outputting the gate drive signal through the gate drive signal output end.

According to some feasible embodiments of the present disclosure, the gate driving unit further comprises a buffer circuit, and the method for driving the gate driving unit comprises: buffering, by the buffer circuit, the gate drive signal to filter a glitch signal out of the gate drive signal, to obtain the carry signal; and outputting the gate drive signal as buffered through the gate drive signal output end.

According to some feasible embodiments of the present disclosure, the delaying, by the shift register circuit, the phase of the input signal inputted by the signal input end under control of the first clock signal input end and the second clock signal input end to obtain the carry signal, and outputting the carry signal through the carry end specifically includes: during a driving period, in a first stage, inputting a first level into the first clock signal input end, inputting a second level into the second clock signal input end, and inputting the first level into the signal input end, in such a manner that a first transmission gate is turned off, a second NAND gate outputs the first level, and a second transmission gate is turned on, so as to write the first level outputted by the second NAND gate into an input end of a phase inverter, to enable the phase inverter to output the second level to the carry end, and to maintain a potential of the carry end at the second level, where an initial potential of the carry end is at the second level;

in a second stage, inputting the second level into the first clock signal input end, inputting the first level into the second clock signal input end, and inputting the first level into the signal input end, in such a manner that a first NAND gate outputs the second level, the first transmission gate is turned on, the second level is inputted into an input end of a phase inverter, the phase inverter outputs the first level to the carry end, and the second transmission gate is turned off, so as to enable the potential of the carry end to be at the first level;

in a third stage, inputting the first level into the first clock signal input end, inputting the second level into the second clock signal input end, and inputting the second level into the signal input end, in such a manner that the first transmission gate is turned off, the second NAND gate outputs the second level, the second transmission gate is turned on, the second level is inputted into the input end of the phase inverter, and the phase inverter outputs the first level to the carry end, so as to maintain the potential of the carry end at the first level; and in a fourth stage, inputting the second level into the first clock signal input end, inputting the first level into the second clock signal input end, and inputting the second level into the signal input end, in such a manner that the first NAND gate outputs the first level, the first transmission gate is turned on, the first level is inputted into the input end of the phase inverter, the phase inverter outputs the second level to the carry end, and the second transmission gate is turned off, so as to maintain the potential of the carry end at the second level.

According to some feasible embodiments of the present disclosure, the regulating, by the pulse width regulation circuit, the pulse width of the carry signal under control of the enable end to obtain the gate drive signal, and outputting the gate drive signal through the gate drive signal output end comprises:

in the first stage, inputting the second level into the enable end, and enabling a potential of the gate drive signal outputted by an AND gate to be the second level, where the potential of the carry end is the second level;

in the second stage, wherein the potential of the carry end is the first level, and the second stage includes a first time period, a second time period, and a third time period that are sequentially set, in the first time period and the third time period, inputting the second level into the enable end, and enabling the potential of the gate drive signal outputted by the AND gate to be the second level; and in the second time period, inputting the first level into enable end, and enabling the potential of the gate drive signal outputted by the AND gate to be the first level, where the carry end outputs the first level;

in the third stage, inputting the second level into the enable end, and enabling the potential of the gate drive signal outputted by the AND gate to be the second level, wherein the carry end outputs the first level; and in the fourth stage, enabling the potential of the gate drive signal outputted by the AND gate to be the second level, where the carry end outputs the second level.

In a third aspect, a gate driving circuitry is further provided according to embodiments of the present disclosure, which includes a plurality of cascaded gate driving units described above. Except a first stage of the gate driving units, a signal input end of each stage of the gate driving units is connected to a carry end of an adjacent upper stage of the gate driving units;

a positive phase clock signal is inputted into each of first clock signal input ends of odd-numbered stages of the gate driving units, and an inverted phase clock signal is inputted into each of second clock signal input ends of the odd-numbered stages of the gate driving units; and the inverted phase clock signal is inputted into each of first clock signal input ends of even-numbered stages of the gate driving units, and the positive phase clock signal is inputted into each of second clock signal input ends of the even-numbered stages of the gate driving units.

In a fourth aspect, a display module is further provided according to embodiments of the present disclosure, which includes the gate driving circuitry described in the first aspect.

According to some feasible embodiments of the present disclosure, the display module according to the fourth aspect is applied to a wearable device.

BRIEF DESCRIPTION OF THE DRAWINGS

In order to better clarify technical solutions in embodiments of the present disclosure, drawings to be used in the descriptions of the embodiments will be briefly described hereinafter. Apparently, the drawings described hereinafter are only some drawings of the present disclosure, and other drawings can be obtained by persons of ordinary skill in the art based on these drawings without any creative effort.

DETAILED DESCRIPTION

Technical solutions of embodiments of the present disclosure are illustrated clearly and completely in conjunction with drawings in the embodiments of the present disclosure. Apparently, the described embodiments are merely a part rather than all of the embodiments of the present disclosure. All other embodiments obtained by persons of ordinary skill in the art based on the embodiments of the present disclosure without creative efforts shall fall within the protection scope of the present disclosure.

Figure 1:
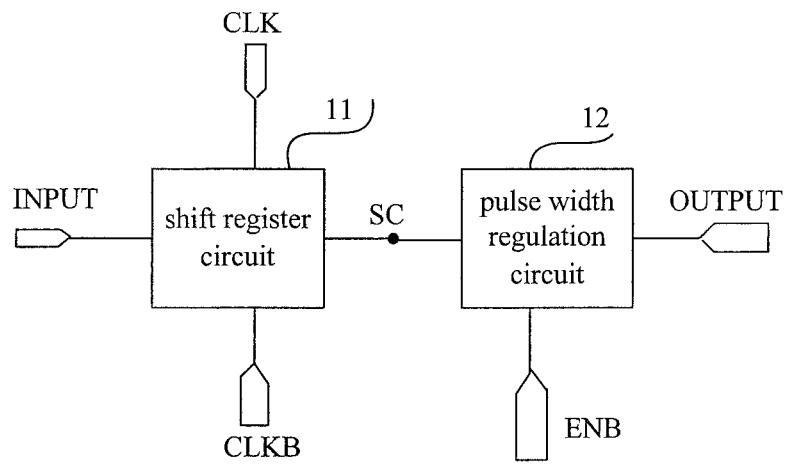
FIG. 1 is a structural block diagram of a gate driving unit according to an embodiment of the present disclosure.

As shown in FIG. 1, a gate driving unit is provided according to an embodiment of the present disclosure and includes:

a shift register circuit 11, which is connected to a signal input end INPUT, a first clock signal input end for inputting a first clock signal CLK, a second clock signal input end for inputting a second clock signal CLKB, and a carry end SC, and is configured to delay a phase of an input signal inputted by the signal input end under control of the first clock signal input end and the second clock signal input end to obtain a carry signal (that is, a phase of the carry signal is delayed by a predetermined time from a phase of the input signal), and to output the carry signal through the carry end SC; and a pulse width regulation circuit 12, which is connected to the carry end SC, an enable end ENB and a gate drive signal output end OUPUT, and is configured to regulate a pulse width of the carry signal under control of the enable end ENB to obtain a gate drive signal, and output the gate drive signal through the gate drive signal output end OUPUT.

The gate driving unit according to the embodiment of the present disclosure includes the shift register circuit 11 and the pulse width regulation circuit 12 for respectively implementing signal phase delay and pulse width regulation, and has a simple structure and a small number of components, which may achieve a narrow bezel design and meet requirements of low power consumption.

Figure 2:
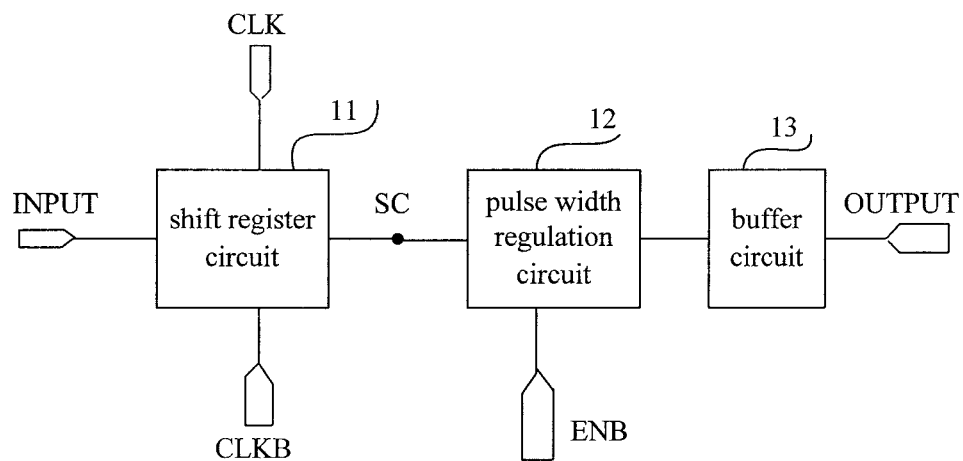
FIG. 2 is a structural block diagram of a gate driving unit according to another embodiment of the present disclosure.

Specifically, as shown in FIG. 2, the gate driving unit according to an embodiment of the present disclosure may further include a buffer circuit 13.

The buffer circuit 13 is connected between the pulse width regulation circuit 12 and the gate drive signal output end OUTPUT, and is configured to buffer the gate drive signal to filter out a glitch signal in the gate drive signal, so as to obtain the buffered gate drive signal, and output the buffered gate drive signal through the gate drive signal output end OUTPUT.

In actual operation, as shown in FIG. 2, the gate driving unit according to the embodiment of the present disclosure may further include the buffer circuit 13 configured to buffer the gate drive signal outputted by the pulse width regulation circuit 12 to filter out the small glitch signal.

Figure 3:
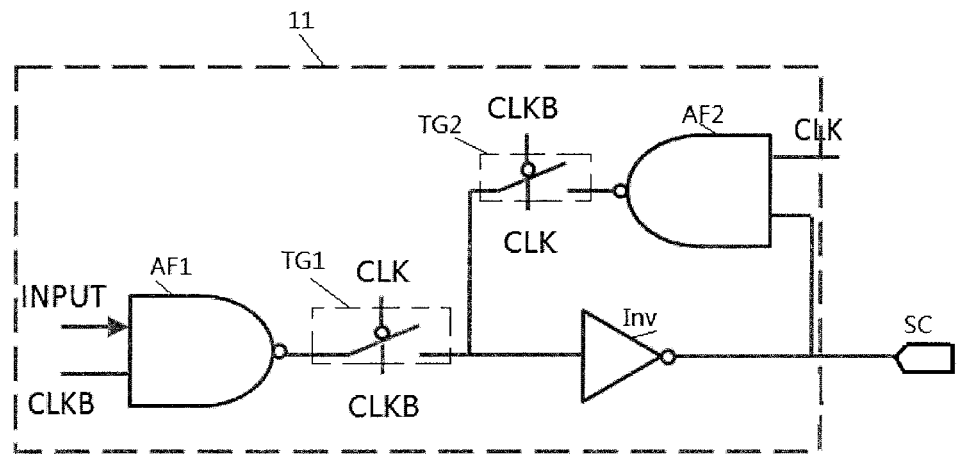
FIG. 3 is a circuit diagram of a shift register circuit of a gate driving unit according to an embodiment of the present disclosure.

Specifically, as shown in FIG. 3, the shift register circuit 11 may include a first NAND gate AF1, a first transmission gate TG1, a phase inverter Inv, a second NAND gate AF2, and a second transmission gate TG2.

A first input end of the first NAND gate AF1 is connected to the signal input end INPUT, and a second input end of the first NAND gate AF1 is connected to the second clock signal input end into which the second clock signal CLKB is inputted.

A positive phase control end of the first transmission gate TG1 is connected to the second clock signal input end into which the second clock signal CLKB is inputted, an inverted phase control end of the first transmission gate TG1 is connected to the first clock signal input end into which the first clock signal CLK is inputted, and an input end of the first transmission gate TG1 is connected to an output end of the first NAND gate AF1.

An input end of the phase inverter Inv is connected to an output end of the first transmission gate TG1, and an output end of the phase inverter Inv is connected to the carry end SC.

A first input end of the second NAND gate AF2 is connected to the first clock signal input end into which the first clock signal CLK is inputted, and a second input end of the second NAND gate AF2 is connected to the carry end SC.

A positive phase control end of the second transmission gate TG2 is connected to the first clock signal input end, an inverted phase control end of the second transmission gate TG2 is connected to the second clock signal input end into which the second clock signal CLKB is inputted, an input end of the second transmission gate TG2 is connected to the output end of the second NAND gate, and an output end of the second transmission gate TG2 is connected to the input end of the phase inverter Inv.

In the embodiment of the present disclosure, as shown in FIG. 3, the shift register circuit 11 includes two NAND gates, two transmission gates and one phase inverter, and the output end of the phase inverter Inv is connected to the carry end SC. That is, the output end of the phase inverter Inv is connected to the pulse width regulation circuit 12.

Figure 4:
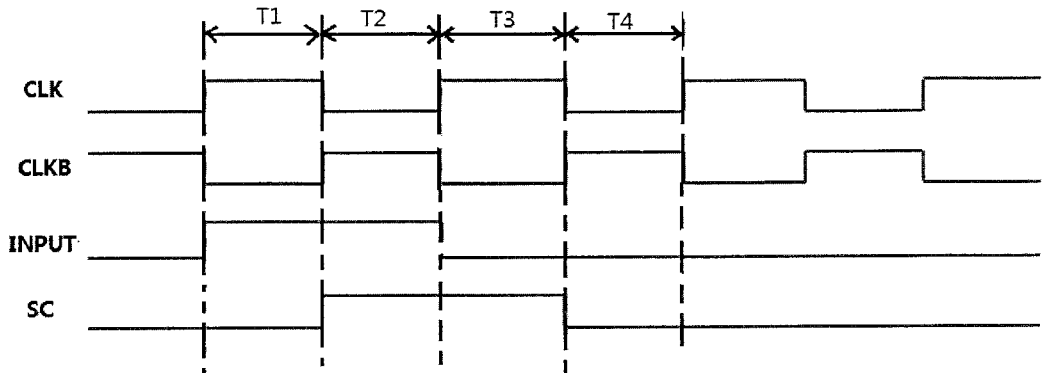
FIG. 4 is an operational timing diagram of the shift register circuit shown in FIG. 3 according to an embodiment of the present disclosure.

FIG. 4 shows an operational timing diagram of the shift register circuit as shown in FIG. 3 according to the present disclosure.

In a first stage T1, CLK is a high level, CLKB is a low level, a high level is inputted into INPUT, AF1 outputs the high level, and TG1 is turned off to make the output end of AF1 and the input end of Inv disconnected. In such a manner, the high level outputted by AF1 cannot be outputted to the input end of Inv, and a potential of SC is maintained at the low level. AF2 outputs the high level, TG2 is turned on to enable the output end of AF2 to be connected to the input end of Inv, and the high level is inputted into the input end of Inv, so as to enable Inv to output the low level.

In a second stage T2, CLK is a low level, CLKB is a high level, a high level is inputted into INPUT, AF1 outputs the low level, and TG1 is turned on to enable the output end of AF1 to be connected to the input end of Inv. In this stage, the low level is inputted into the input end of Inv, and Inv outputs a high level to SC. TG2 is turned off to disconnect the connection between the output end of AF2 and the input end of Inv.

In a third stage T3, CLK is a high level, CLKB is a low level, a low level is inputted into INPUT, AF1 outputs a high level, TG1 is turned off to enable the output end of AF1 and the input end of Inv to be disconnected, thus the high level outputted by AF1 cannot be outputted to the input end of Inv, and the potential of SC is maintained at a high level. Meanwhile, AF2 outputs a low level, and TG2 is turned on to enable the output end of AF2 and the input end of Inv to be connected, so as to enable Inv to output a high level.

In a fourth stage T4, CLK is a low level, CLKB is a high level, a low level is inputted into INPUT, AF1 outputs a high level, TG1 is turned on to enable the output end of AF1 and the input end of Inv to be connected, and Inv outputs the low level. That is, the potential at SC is the low level.

As can be seen from FIG. 4, the carry signal outputted from SC is shifted backward as compared with the input signal inputted into INPUT. In actual operation, the carry signal outputted from SC is used as an input signal of a next-stage of gate driving unit adjacent to the gate driving unit.

Figure 5A:
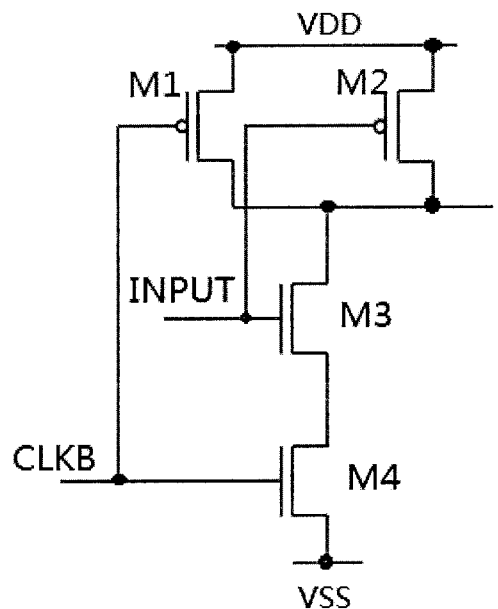
FIG. 5A is a circuit diagram of a NAND gate (NAND) of a gate driving unit in the present disclosure.

As shown in FIG. 5A, the first NAND gate is provided and includes a first transistor M1, a second transistor M2, a third transistor M3, and a fourth transistor M4.

A gate electrode of M1 and a gate electrode of M4 are both connected to the second clock signal input end for inputting the second clock signal CLKB. A gate electrode of M2 and a gate electrode of M3 are both connected to INPUT. Both M1 and M2 are P-type transistors, and M3 and M4 are both N-type transistors.

A source electrode of M1 and a source electrode of M2 are both connected to a high level VDD. A drain electrode of M1 and a drain electrode of M2 are both connected to a drain electrode of M3. A source electrode of M3 is connected to a drain electrode of M4, and a source electrode of M4 is connected to a low level VSS. The drain electrode of M2 is connected to the output end of the first NAND gate.

According to an embodiment, operating states of the first NAND gate as shown in FIG. 5A are as follows.

When CLKB is a high level and a high level is inputted into INPUT, M1 is turned off, M4 is turned on, M2 is turned off, M3 is turned on, and the first NAND gate outputs a low level.

When CLKB is a high level and a low level is inputted into INPUT, M1 is turned off, M4 is turned on, M2 is turned on, M3 is turned off, and the first NAND gate outputs a high level.

When CLKB is a low level and a high level is inputted into INPUT, M1 is turned on, M4 is turned off, M2 is turned off, M3 is turned on, and the first NAND gate outputs a high level.

When CLKB is a low level and a low level is inputted into INPUT, M1 is turned on, M4 is turned off, M2 is turned on, M3 is turned off, and the first NAND gate outputs a high level.

Figure 5B:
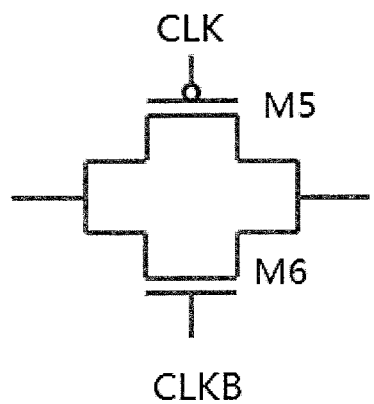
FIG. 5B is a circuit diagram of a first transmission gate of a gate driving unit according to an embodiment of the present disclosure.

As shown in FIG. 5B, the first transmission gate is provided and includes: a fifth transistor M5 and a sixth transistor M6. A gate electrode of the fifth transistor M5 is connected to the first clock signal input end for inputting the first clock signal CLK, and a gate electrode of the sixth transistor M6 is connected to the second clock signal input end for inputting the second clock signal CLKB. M5 is a P-type transistor, and M6 is an N-type transistor.

A source electrode of M5 is connected to a drain electrode of M6, and a drain electrode of M5 is connected to a source electrode of M6.

The source electrode of M5 is connected to the input end of the first transmission gate, and the drain electrode of M5 is connected to the output end of the first transmission gate.

Operating states of the first transmission gate as shown in FIG. 5B according to an embodiment of the present disclosure are as follows. When CLK is a low level and CLKB is a high level, both M5 and M6 are turned on, and the first transmission gate is able to transmit data; and when CLK is a high level and CLKB is a low level, both M5 and M6 are turned off, and the first transmission gate is unable to transmit data.

Figure 5C:
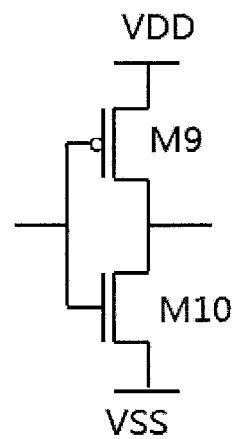
FIG. 5C is a circuit diagram of a phase inverter of a gate driving unit according to an embodiment of the present disclosure.

As shown in FIG. 5C, a phase inverter is provided and includes a ninth transistor M9 and a tenth transistor M10. A gate electrode of the ninth transistor M9 and a gate electrode of the tenth transistor M10 are both connected to the input end of the phase inverter.

A source electrode of M9 is connected to a high level VDD, a source electrode of M10 is connected to a low level VSS, a drain electrode of M9 is connected to a drain electrode of M10, and the drain electrode of M9 is connected to the output end of the phase inverter. M9 is a P-type transistor, and M10 is an N-type transistor.

According to an embodiment of the present disclosure, operating states of the phase inverter as shown in FIG. 5C are as follows. When the input end of the phase inverter is connected to a high level signal, M9 is turned off, M10 is turned on, and the phase inverter outputs a low level signal; and when the input end of the phase inverter is connected to a low level signal, M9 is turned on, M10 is turned off, and the phase inverter outputs a high level signal.

In a specific implementation, each of the first NAND gate, the first transmission gate, the phase inverter, the second NAND gate, and the second transmission gate consists of an N-type transistor and a P-type transistor.

More specifically, each of the first NAND gate, the first transmission gate, the phase inverter, the second NAND gate, and the second transmission gate may consist of a P-type TFT (thin film transistor) and an N-type TFT that are fabricated based on LTPS (Low Temperature Poly-silicon technology) process. Therefore, a formed logic circuit can make full use of characteristics of different types of transistors that compensate for each other, and can transmit digital signals quickly, simply and conveniently, and has a great advantage over a gate driving unit formed by a single type of TFT.

Specifically, the pulse width regulation circuit 12 may include an AND gate. A first input end of the AND gate is connected to the carry end, a second input end of the AND gate is connected to the enable end, and an output end of the AND gate is connected to the gate drive signal output end through the buffer circuit 13.

In actual operation, when the carry end outputs a low level, and the enable end outputs a low level, the AND gate outputs a low level; when the carry end outputs a high level, and the enable end outputs a high level, the AND gate outputs a high level; when the carry end outputs a high level, and the enable end outputs a low level, the AND gate outputs a low level; and when the carry end outputs a low level, and the enable end outputs a high level, the AND gate outputs a low level.

In a specific implementation, the AND gate may be composed of N-type transistors and P-type transistors.

More specifically, the AND gate may be formed by the P-type TFTs and the N-type TFTs that are fabricated based on LTPS process, and the formed logic circuit can make full use of characteristics of different types of transistors that compensate for each other, and can transmit digital signals quickly, simply and conveniently, and has a great advantage over a gate driving unit formed by a single type of TFT.

Figure 5D:
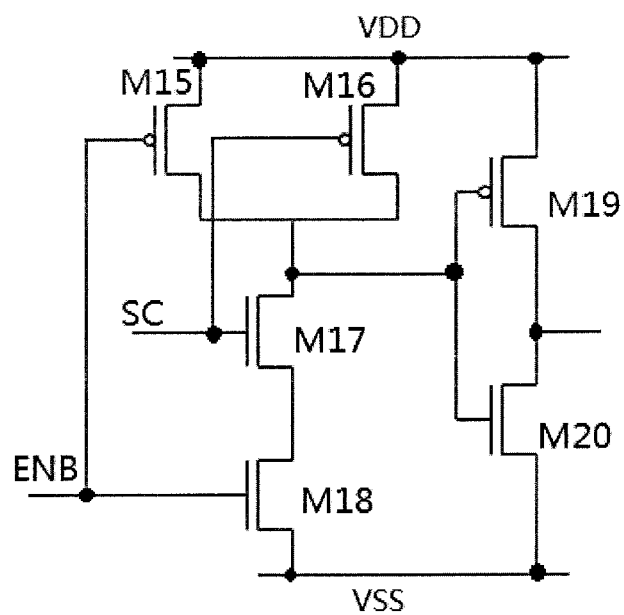
FIG. 5D is a circuit diagram of an AND gate (AND) of a gate driving unit according to an embodiment of the present disclosure.

As shown in FIG. 5D, the AND gate may include a fifteenth transistor M15, a sixteenth transistor M16, a seventeenth transistor M17, an eighteenth transistor M18, a nineteenth transistor M19, and a twentieth transistor M20.

A gate electrode of M15 and a gate electrode of M18 are both connected to the enable end ENB, and a gate electrode of M16 and a gate electrode of M17 are both connected to the carry end SC. M15, M16 and M19 are all P-type transistors, and M17, M18 and M20 are all N-type transistors.

A source electrode of M15 and a source electrode of M16 are connected to a high level VDD. A drain electrode of M15 and a drain electrode of M16 are both connected to a drain electrode of M17. A source electrode of M17 is connected to a drain electrode of M18, and a source electrode of M18 is connected to the low level VSS.

The drain electrode of M17 is connected to a gate electrode of M19 and a gate electrode of M20; a source electrode of M19 is connected to the high level VDD; a drain electrode of M19 is connected to a drain electrode of M20; and a source electrode of M20 is connected to the low level VSS. The drain electrode of M19 is connected to the output end of the AND gate.

In the present disclosure, operating states of the AND gate as shown in FIG. 5D are as follows.

When ENB outputs a high level and the potential of SC is a high level, M15 is turned off, M18 is turned on, M16 is turned off, M17 is turned on, thus the gate electrode of M19 and the gate electrode of M20 are connected to the low level, M19 is turned on, M20 is turned off, and the AND gate outputs a high level.

When ENB outputs a high level and the potential of SC is a low level, M15 is turned off, M18 is turned on, M17 is turned off, M16 is turned on, thus the gate electrode of M19 and the gate electrode of M20 are connected to the high level, M20 is turned on, and the AND gate outputs a low level.

When ENB outputs a low level and the potential of SC is a high level, M15 turns on, M18 turns off, M17 turns on, M16 turns off, thus the high level is inputted into both the gate electrode of M19 and the gate electrode of M20, M20 is turned on, and the AND gate outputs a low level.

When ENB outputs a low level and the potential of SC is a low level, M15 turns on, M18 turns off, M17 turns off, M16 turns on, thus the high level is inputted into both the gate electrode of M19 and the gate electrode of M20, M20 is turned on, and the AND gate outputs a low level.

Specifically, the buffer circuit 13 may include: a buffer, having an input end connected to the output end of the AND gate, and an output end connected to the gate drive signal output end.

In a specific implementation, the buffer may be formed by an N-type transistor and a P-type transistor.

More specifically, the buffer may be formed by a P-type TFT and an N-type TFT that are fabricated based on LTPS process, and the formed logic circuit can make full use of characteristics of different types of transistors that compensate for each other, and can transmit digital signals quickly, simply and conveniently, and has a great advantage over a gate driving unit formed by a single type of TFT.

Figure 5E:
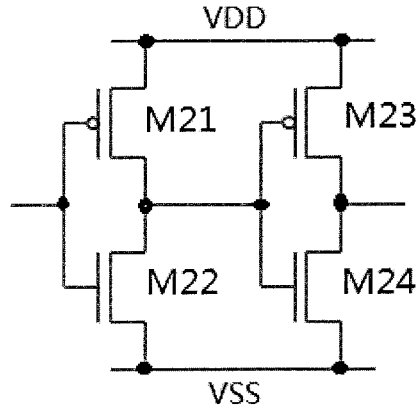
FIG. 5E is a circuit diagram of a buffer of a gate driving unit according to an embodiment of the present disclosure.

As shown in FIG. 5E, the buffer may include a twenty-first transistor M21, a twenty-second transistor M22, a twenty-third transistor M23, and a twenty-fourth transistor M24. A gate electrode of M21 and a gate electrode of M22 are both connected to the input end of the buffer. Both M21 and M23 are P-type transistors, and both M22 and M24 are N-type transistors. A source electrode of M21 and a source electrode of M23 are connected to a high level VDD; a drain electrode of M21 is connected to a gate electrode of M23 and a gate electrode of M24; the drain electrode of M21 is connected to a drain electrode of M22; a drain electrode of M23 is connected to a drain electrode of M24; a source electrode of M22 and a source electrode of M24 are both connected to the low level VSS; and the drain electrode of M23 is connected to the output end of the buffer.

According to an embodiment of the present disclosure, operating states of the buffer as shown in FIG. 5E are as follows. When a high level signal is inputted into the input end of the buffer, M21 is turned off, M22 is turned on, M23 is turned on, M24 is turned off, and the output end of the buffer outputs a high level signal. When a low level signal is inputted into the input end of the buffer, M21 is turned on, M22 is turned off, M23 is turned off, M24 is turned on, and the output end of the buffer outputs a low level signal.

The gate driving unit in the present disclosure is described below by way of a specific embodiment.

Figure 6:
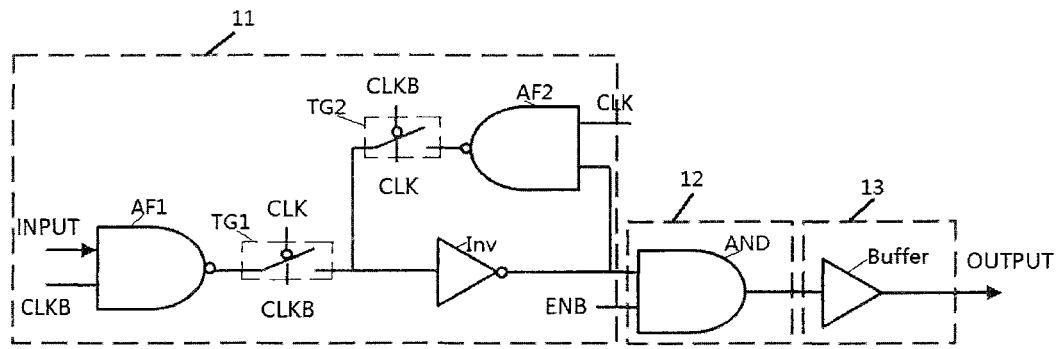
FIG. 6 is a circuit diagram of a gate driving unit according to another embodiment of the present disclosure.

As shown in FIG. 6, a gate driving unit according to the specific embodiment of the present disclosure includes a shift register circuit 11, a pulse width regulation circuit 12, and a buffer circuit 13. The buffer circuit 13 includes a buffer (Buffer).

The shift register circuit 11 includes a first NAND gate AF1, a first transmission gate TG1, a phase inverter Inv, a second NAND gate AF2, and a second transmission gate TG2.

A first input end of the first NAND gate AF1 is connected to the signal input end INPUT, and a second input end of the first NAND gate AF1 is connected to the second clock signal input end into which the second clock signal CLKB is inputted.

A positive phase control end of the first transmission gate TG1 is connected to the second clock signal input end into which the second clock signal CLKB is inputted, an inverted phase control end of the first transmission gate TG1 is connected to the first clock signal input end into which the first clock signal CLK is inputted, and an input end of the first transmission gate TG1 is connected to an output end of the first NAND gate AF1.

An input end of the phase inverter Inv is connected to an output end of the first transmission gate TG1, and an output end of the phase inverter Inv is connected to the carry end SC.

A first input end of the second NAND gate AF2 is connected to the first clock signal input end into which the first clock signal CLK is inputted, and a second input end of the second NAND gate AF2 is connected to the carry end SC.

A positive phase control end of the second transmission gate TG2 is connected to the first clock signal input end, an inverted phase control end of the second transmission gate TG2 is connected to the second clock signal input end into which the second clock signal CLKB is inputted, an input end of the second transmission gate TG2 is connected to the output end of the second NAND gate, and an output end of the second transmission gate TG2 is connected to the input end of the phase inverter Inv.

The pulse width regulation circuit 12 includes an AND gate. A first input end of the AND gate is connected to the carry end SC, a second input end of the AND gate is connected to the enable end ENB, and an output end of the AND gate is connected to the gate drive signal output end OUTPUT through the buffer.

The input end of the buffer is connected to the output end of the AND gate; and the output end of the buffer is connected to the gate drive signal output end OUTPUT.

Figure 7:
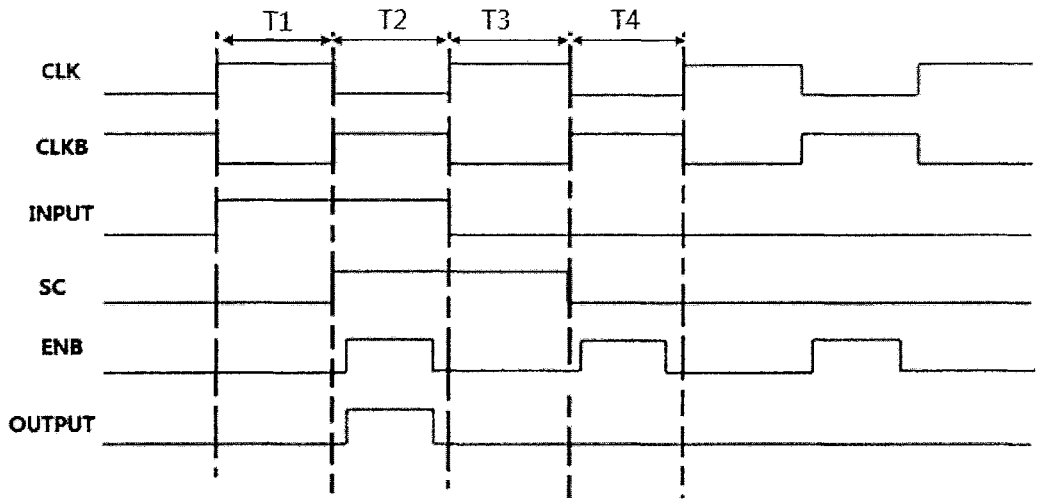
FIG. 7 is an operational timing diagram of the gate driving unit as shown in FIG. 6 according to a specific embodiment of the present disclosure.

As shown in FIG. 7, CLK and CLKB each is a clock signal with a duty ratio equal to 50%, a period of CLK is equal to that of CLKB, and phases of CLK and CLKB are mutually inverted.

As shown in FIG. 7, operating states of the gate driving unit as shown in FIG. 6 are as follows according to the present disclosure.

In a first stage T1, CLK is a high level, CLKB is a low level, a high level is inputted into INPUT, AF1 outputs the high level, and TG1 is turned off to make the output end of AF1 and the input end of Inv disconnected. In such a manner, the high level outputted by AF1 cannot be outputted to the input end of Inv, and a potential of SC is maintained at the low level. AF2 outputs the high level, TG2 is turned on to enable the output end of AF2 to be connected to the input end of Inv, and the high level is inputted into the input end of Inv, so as to enable Inv to output a low level. ENB outputs a low level, and AND outputs a low level, thus OUTPUT outputs a low level.

In a second stage T2, CLK is a low level, CLKB is a high level, a high level is inputted into INPUT, AF1 outputs a low level, and TG1 is turned on to enable the output end of AF1 to be connected to the input end of Inv. In this stage, the low level is inputted into the input end of Inv, and Inv outputs a high level to SC. TG2 is turned off to disconnect the connection between the output end of AF2 and the input end of Inv. ENB outputs a high level, and AND outputs a high level, thus OUTPUT outputs a high level.

In a third stage T3, CLK is a high level, CLKB is a low level, a low level is inputted into INPUT, AF1 outputs a high level, TG1 is turned off to enable the output end of AF1 and the input end of Inv to be disconnected, thus the high level outputted by AF1 cannot be outputted to the input end of Inv, and the potential of SC is maintained at a high level. Meanwhile, AF2 outputs a low level, and TG2 is turned on to enable the output end of AF2 and the input end of Inv to be connected, so as to enable Inv to output a high level. ENB outputs a low level, and AND outputs a low level, thus outputting a low level by OUTPUT.

In a fourth stage T4, CLK is a low level, CLKB is a high level, a low level is inputted into INPUT, AF1 outputs a high level, TG1 is turned on to enable the output end of AF1 and the input end of Inv to be connected, and Inv outputs the low level. That is, the potential at SC is the low level. ENB outputs a high level, and AND outputs a low level, thus outputting a low level by OUTPUT.

As can be seen from FIG. 7, the carry signal outputted from SC is shifted backward as compared with the input signal inputted into INPUT, the AND gate of the pulse width regulation circuit 12 regulates a pulse width of the carry signal under the control of the enable end ENB to obtain the gate drive signal, and the gate drive signal is outputted through the gate drive signal output end OUTPUT. In actual operation, the carry signal outputted from SC is used as an input signal of a next-stage of gate driving unit adjacent to the gate driving unit.

Figure 8:
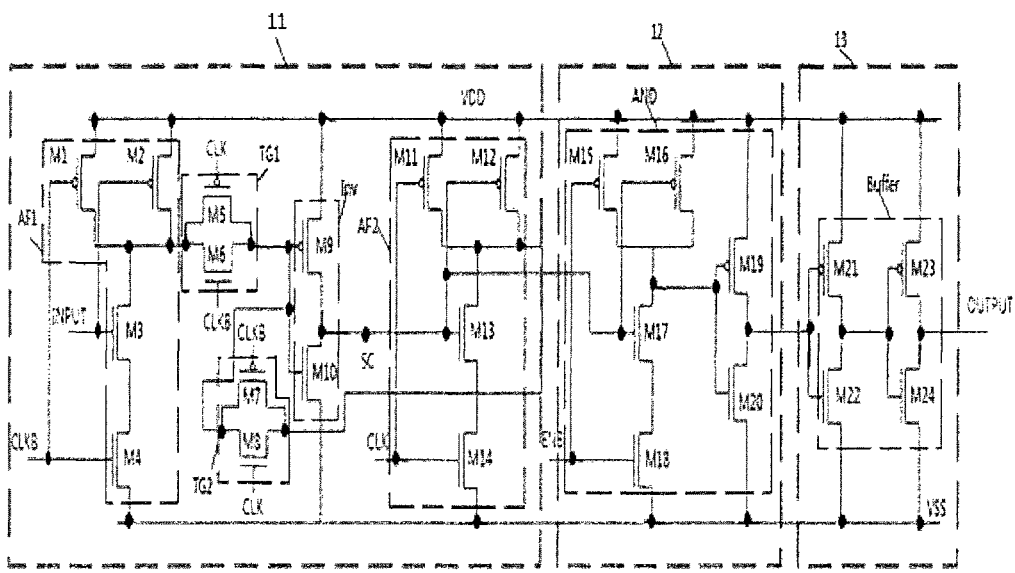
FIG. 8 is a circuit diagram of a gate driving unit according to another specific embodiment of the present disclosure.

FIG. 8 is a specific circuit diagram of the gate driving unit shown in FIG. 6 according to a specific embodiment of the present disclosure, which is formed by N-type TFTs and P-type TFTs.

FIG. 8 shows a gate driving unit, which is based on the gate driving unit shown in FIG. 6. The first NAND gate AF1 includes a first transistor M1, a second transistor M2, a third transistor M3 and a fourth transistor M4.

A gate electrode of M1 and a gate electrode of M4 are both connected to a second clock signal input end for inputting a second clock signal CLKB. A gate electrode of M2 and a gate electrode of M3 are both connected to INPUT. Both M1 and M2 are P-type transistors, and M3 and M4 are both N-type transistors.

A source electrode of M1 and a source electrode of M2 are both connected to a high level VDD. A drain electrode of M1 and a drain electrode of M2 are both connected to a drain electrode of M3. A source electrode of M3 is connected to a drain electrode of M4, and a low level VSS is inputted into a source electrode of M4. The drain electrode of M2 is connected to the output end of the first NAND gate AF1.

The first transmission gate TG1 includes: a fifth transistor M5 and a sixth transistor M6. A gate electrode of the fifth transistor M5 is connected to the first clock signal input end for inputting the first clock signal CLK, and a gate electrode of the sixth transistor M6 is connected to the second clock signal input end for inputting the second clock signal CLKB. M5 is a P-type transistor, and M6 is an N-type transistor.

A source electrode of M5 is connected to a drain electrode of M6, and a drain electrode of M5 is connected to a source electrode of M6.

The source electrode of M5 is connected to the input end of the first transmission gate TG1, and the drain electrode of M5 is connected to the output end of the first transmission gate TG1.

The second transmission gate TG2 includes a seventh transistor M7 and an eighth transistor M8. M7 is a P-type transistor, and M8 is an N-type transistor. The phase inverter Inv includes a ninth transistor M9 and a tenth transistor M10. A gate electrode of the ninth transistor M9 and a gate electrode of the tenth transistor M10 are both connected to the input end of the phase inverter Inv.

A source electrode of M9 is connected to a high level VDD, a source electrode of M10 is connected to a low level VSS, and a drain electrode of M9 is connected to a drain electrode of M10. The drain electrode of M9 is connected to the output end of the phase inverter Inv and the carry end SC. M9 is a P-type transistor, and M10 is an N-type transistor.

The second NAND gate AF2 includes an eleventh transistor M11, a twelfth transistor M12, a thirteenth transistor M13 and a fourteenth transistor M14. A gate electrode of M11 and a gate electrode of M14 are both connected to the first clock signal input end for inputting the first clock signal CLK, and a gate electrode of M12 and a gate electrode of M13 are both connected to the carry end SC.

M11 and M12 each is a P-type transistor, and M13 and M14 each is an N-type transistor.

A source electrode of M11 and a source electrode of M12 are both connected to a high level VDD, and a drain electrode of M11 and a drain electrode of M12 are both connected to the output end of the second NAND gate AF2.

A drain electrode of M13 is connected to the output end of the second NAND gate AF2, a drain electrode of M14 is connected to a source electrode of M13, and a source electrode of M14 is connected to the low level VSS.

A source electrode of M7 included in the second transmission gate TG2 is connected to the output end of the second NAND gate AF2. A drain electrode of M8 is connected to the source electrode of M7, a drain electrode of M7 is connected to the input end of the phase inverter Inv, and a source electrode of M8 is connected to the drain electrode of M7.

The AND gate (AND) includes a fifteenth transistor M15, a sixteenth transistor M16, a seventeenth transistor M17, an eighteenth transistor M18, a nineteenth transistor M19, and a twentieth transistor M20.

A gate electrode of M15 and a gate electrode of M18 are both connected to the enable end ENB, and a gate electrode of M16 and a gate electrode of M17 are both connected to the carry end SC. All of M15, M16 and M19 are P-type transistors, and M17, M18 and M20 are all N-type transistors.

A source electrode of M15 and a source electrode of M16 are connected to a high level VDD. A drain electrode of M15 and a drain electrode of M16 are connected to a drain electrode of M17. A source electrode of M17 is connected to a drain electrode of M18, and a source electrode of M18 is connected to the low level VSS.

The drain electrode of M17 is connected to a gate electrode of M19 and a gate electrode of M20; a source electrode of M19 is connected to the high level VDD; a drain electrode of M19 is connected to a drain electrode of M20; and a source electrode of M20 is connected to the low level VSS. The drain electrode of M19 is connected to the output end of the AND gate.

The buffer (Buffer) includes a twenty-first transistor M21, a twenty-second transistor M22, a twenty-third transistor M23, and a twenty-fourth transistor M24. A gate electrode of M21 and a gate electrode of M22 are both connected to the input end of the buffer. Both M21 and M23 are P-type transistors, and both M22 and M24 are N-type transistors. A source electrode of M21 and a source electrode of M23 are connected to a high level VDD; a drain electrode of M21 is connected to a gate electrode of M23 and a gate electrode of M24; the drain electrode of M21 is connected to a drain electrode of M22; a drain electrode of M23 is connected to a drain electrode of M24; a source electrode of M22 and a source electrode of M24 are both connected to the low level VSS; and the drain electrode of M23 is connected to the output end of the buffer.

According to a specific embodiment of the present disclosure, as shown in FIG. 7, the gate driving unit shown in FIG. 8 operates as follows.

In a first stage T1, a high level is inputted into INPUT, CLK is a high level, CLKB is a low level, ENB outputs a low level. In the first transmission gate, M5 and M6 are turned off, an initial potential of SC is a low level, M12 and M14 are turned on, M11 and M13 are turned off, and the second NAND gate outputs a high level signal. In the second transmission gate, M7 and M8 are turned on, and accordingly the high level signal is inputted into the input end of the phase inverter, which enables M9 in the phase inverter to be turned off and M10 in the phase inverter to be turned on, thereby outputting a low level signal by the phase inverter. In such a manner, data circulates in a loop formed by the second NAND gate, the second transmission gate and the phase inverter, and thereby maintaining the potential of SC at a low level, and enabling the AND gate to output a low level signal to OUTPUT.

In a second phase T2, a high level is inputted into INPUT, a high level is outputted at ENB, CLK is a low level, and CLKB is a high level. In the first transmission gate, M5 and M6 are turned on, and two input ends of the first NAND gate are respectively connected to CLKB and the input signal inputted by INPUT. Since CLKB is the high level, and the high level is inputted into INPUT, M1 and M2 are turned off, M3 and M4 are turned on, the first NAND gate outputs a low level signal. The outputted low level signal is transmitted to the phase inverter via the first transmission gate, thus M9 is turned on, M10 is turned off, and the phase inverter outputs a high level signal to SC; and then the data enters the pulse width regulation circuit 12. In the AND gate included in the pulse width regulation circuit 12, two input ends of the AND gate are respectively connected to the high level signal and a regulation enable signal outputted at ENB. In this stage, the regulation enable signal is a high level, M17, M18 and M19 are all turned on, and M15, M16 and M20 are all turned off, thus the AND gate outputs a high level signal. In this case, the data enters the buffer circuit 13, M22 and M23 are turned on, M21 and M24 are turned off, and the AND gate outputs a high level signal to OUTPUT.

In a third stage T3, INPUT inputs a low level, CLK is a high level, CLKB is a low level, and a low level is outputted at ENB. In the first transmission gate, M5 and M6 are turned off, and a signal outputted by AF1 is unable to be outputted to the input end of Inv, and accordingly the potential of SC is maintained at a high level. Two input ends of the first NAND gate are respectively connected to CLKB and the high level, M11 and M12 are turned off, M13 and M14 are turned on, and the second NAND gate outputs a low level signal. In the second transmission gate, M7 and M8 are both turned on, the low level signal outputted by the second NAND gate is transmitted to the input end of Inv through the second transmission gate, and Inv outputs a high level signal. In this way, the data is cyclically flowed in a loop composed of the second NAND gate, the second transmission gate and the phase inverter, so that the potential of SC is kept high, and the AND gate outputs a low level signal to OUTPUT.

In a fourth stage T4, a low level is inputted into INPUT, CLK is a low level, CLKB is a high level, and a high level is outputted at ENB. In the first transmission gate, M5 and M6 are both turned on, two input ends of the first NAND gate are respectively connected to CLKB and the low level inputted into INPUT. Due to the high level of CLKB and the low level at INPUT, M1 is turned off, M2 is turned on, M3 is turned off, M4 is turned on, and thus the first NAND gate outputs a high level signal. The high level signal is transmitted to the phase inverter through the first transmission gate, so that M9 is turned off, M10 is turned on, and the phase inverter outputs a low level signal to SC; and then the data enters the pulse width regulation circuit 12. In the AND gate of the pulse width regulation circuit 12, two input ends of the AND gate are respectively connected to the low level signal and the regulation enable signal outputted at ENB. In this stage, the regulation enable signal is a high level, M17 is turned off, M18 is turned on, M19 is turned off, M15 is turned off, M16 and M20 are both turned on, and thus the AND gate outputs a low level signal. Next, the data enters the buffer circuit 13, so that M22 and M23 are turned on, M21 and M24 are turned off, and the AND gate outputs a low level signal to OUTPUT.

Figure 9:
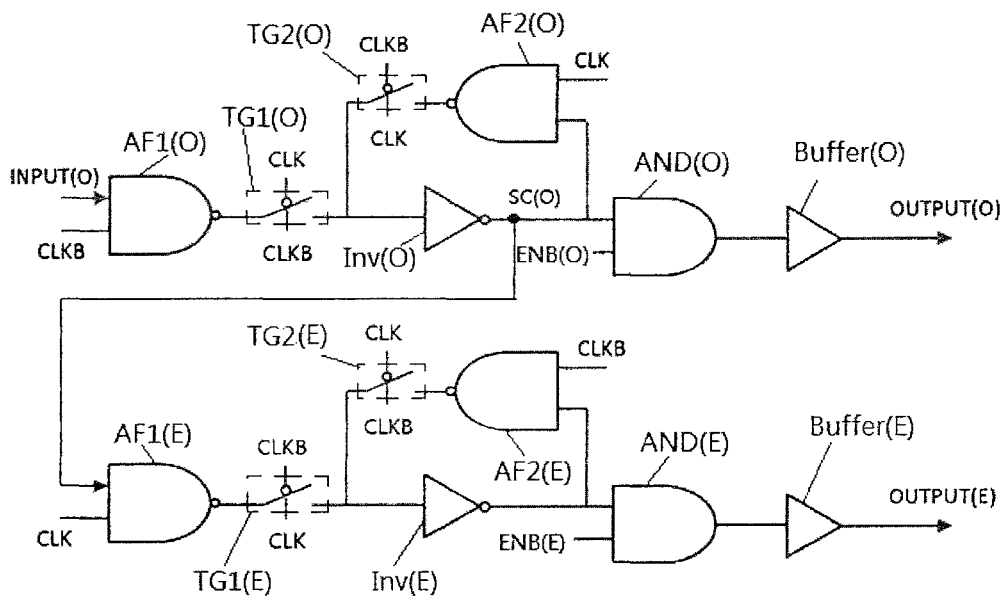
FIG. 9 is a circuit diagram of a gate driving unit in an odd-numbered row and a gate driving unit in an even-numbered row adjacent to the odd-numbered row included in a gate driving circuitry according to an embodiment of the present disclosure.

As shown in FIG. 9, a gate driving unit in the upper row is an odd-numbered row of gate driving unit, and a gate driving unit in the lower row is an even-numbered row of gate driving unit. The odd-numbered row of gate driving unit and the even-numbered row of gate driving unit are cascaded with each other, and a carry end SC(O) of the odd-numbered row of gate driving unit is connected to a signal input end INPUT(E) of the even-numbered row of gate driving unit.

In FIG. 9, a signal input end of the odd-numbered row of gate driving unit is labeled INPUT(O), a signal output end of the odd-numbered row of gate driving unit is labeled OUTPUT(O), the signal input end of the even-numbered row of gate driving unit is labeled INPUT(E), and a signal output end of the even-numbered row of gate driving unit is labeled OUTPUT(E). A first clock signal is labeled CLK, a second clock signal is labeled CLKB, an enable end of the odd-numbered row of gate driving unit is labeled ENB(O), and an enable end of the even-numbered row of gate driving unit is labeled ENB(E).

In FIG. 9, a first NAND gate in the odd-numbered row of gate driving unit is labeled AF1(O), and a first transmission gate in the odd-numbered row of gate driving unit is labeled TG1(O), a phase inverter in the odd-numbered row of gate driving unit is labeled Inv(O), a second NAND gate in the odd-numbered row of gate driving unit is labeled AF2(O), a second transmission gate in the odd-numbered row of gate driving unit is labeled TG2(O), an AND gate in the odd-numbered row of gate driving unit is labeled AND(O), and a buffer in the odd-numbered row of gate driving unit is labeled Buffer(O).

In FIG. 9, a first NAND gate in the even-numbered row of gate driving unit is labeled AF1(E), and a first transmission gate in the even-numbered row of gate driving unit is labeled TG1(E), a phase inverter in the even-numbered row of gate driving unit is labeled Inv(E), a second NAND gate in the even-numbered row of gate driving unit is labeled AF2(E), a second transmission gate in the even-numbered row of gate driving unit is labeled TG2(E), an AND gate in the even-numbered row of gate driving unit is labeled AND(E), and a buffer in the even-numbered row of gate driving unit is labeled Buffer(E).

An inverted phase control end of TG1(O) is connected to CLK, a positive phase control end of TG1(O) is connected to CLKB, an inverted phase control end of TG2(O) is connected to CLKB, and a positive phase control end of TG2(O) is connected to CLK. An inverted phase control end of TG1(E) is connected to CLKB, a positive phase control end of TG1(E) is connected to CLK, an inverted phase control end of TG2(E) is connected to CLK, and a positive phase control end of TG2(E) is connected to CLKB.

Figure 10:
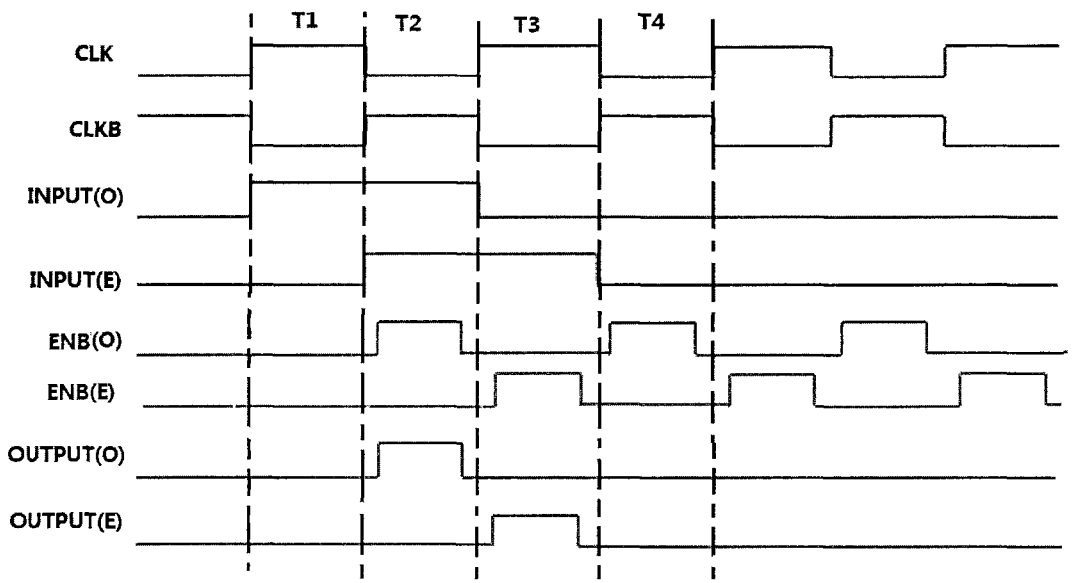
FIG. 10 is an operational timing diagram of the gate driving unit in an odd-numbered row and the gate driving unit in an even-numbered row adjacent to the odd-numbered row that are as shown in FIG. 9 according to an embodiment of the present disclosure.

As shown in FIG. 10, each of CLK and CLKB is a clock signal with a duty ratio equal to 50%, a period of CLK is equal to that of CLKB, and phases of CLK and CLKB are mutually inverted, which are similar to these in FIG. 7.

As shown in FIG. 10, a carry signal outputted from SC(O) is an input signal inputted into INPUT(E), and a phase of the input signal inputted into INPUT(E) is delayed by half a clock period than a phase of the input signal inputted into INPUT(O). Thus, a phase of a signal of each even-numbered row of gate driving unit in each stage is delayed by half the clock period from a phase of a signal of an even-numbered row of gate driving unit adjacent to the even-numbered row of gate driving unit in the corresponding stage, and a phase of a gate drive signal outputted by OUTPUT(E) is delayed by half the clock period from a phase of a gate drive signal outputted by OUTPUT(O). Similarly, a phase of a gate drive signal outputted by a gate driving unit in a certain row is delayed by half the clock period from a phase of a gate drive signal outputted by a gate driving unit in a row immediately previous to the certain row, and so on, until a gate driving unit in the last row.

It is worth noting that a waveform of ENB(E) is different from that of ENB(O). A phase of ENB(E) is delayed by a half of the clock cycle from a phase of ENB(O).

According to the embodiments of the present disclosure, various logic gates are fabricated based on the LTPS process, and are used to respectively construct the shift register module, the pulse width regulation circuit, and the buffer circuit, which are used to achieve signal phase delay, pulse width regulation, and buffering functions, respectively. Finally, various modules are cascaded to form the gate driving circuitry. The gate driving unit according to the embodiments of the present disclosure has a simple structure and a small number of transistors, which may achieve a narrow bezel design and meet requirements on low power consumption.

Figure 11:
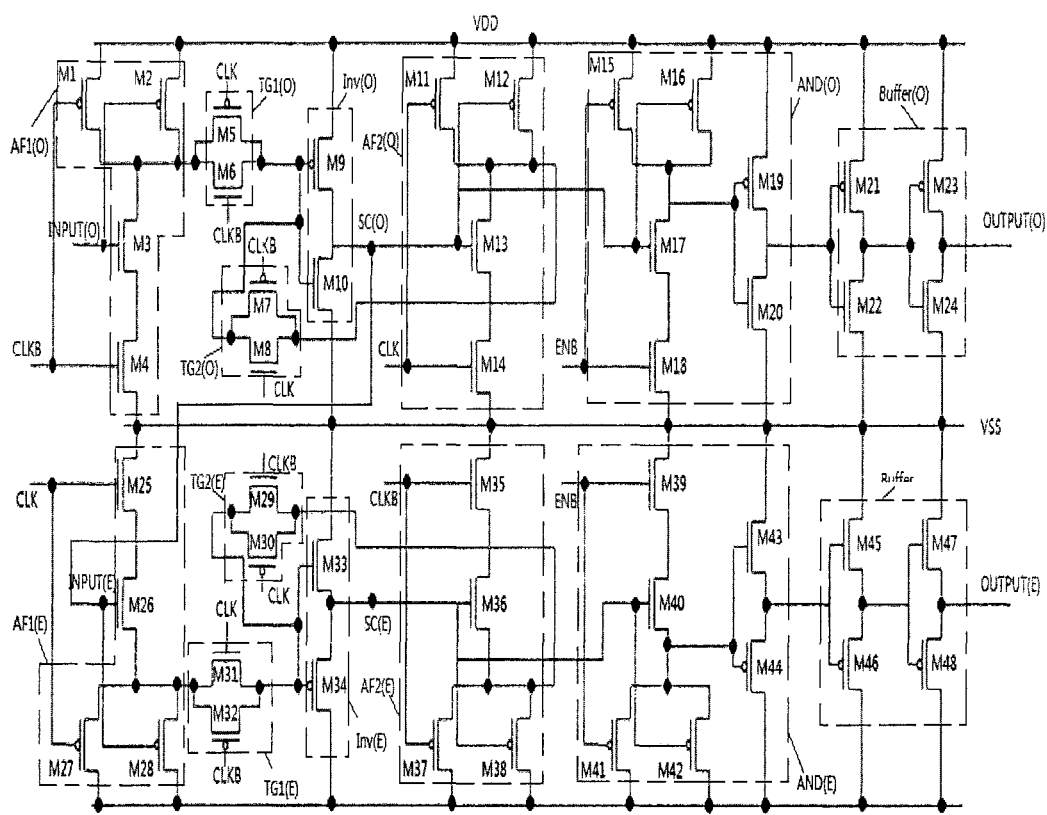
FIG. 11 is a circuit diagram of a gate driving unit in an odd-numbered row and a gate driving unit in an even-numbered row adjacent to the odd-numbered row included in a gate driving circuitry according to a specific embodiment of the present disclosure.

FIG. 11 shows a circuit diagram of a gate driving circuitry, which is based on a gate driving unit in an odd-numbered row and a gate driving unit in an even-numbered row that are cascaded with each other.

AF1(O) includes a first transistor M1, a second transistor M2, a third transistor M3 and a fourth transistor M4.

A gate electrode of M1 and a gate electrode of M4 are both connected to a second clock signal input end for inputting a second clock signal CLKB. A gate electrode of M2 and a gate electrode of M3 are both connected to INPUT(O). Both M1 and M2 are P-type transistors, and M3 and M4 are both N-type transistors.

A source electrode of M1 and a source electrode of M2 are both connected to a high level VDD. A drain electrode of M1 and a drain electrode of M2 are both connected to a drain electrode of M3. A source electrode of M3 is connected to a drain electrode of M4, and a low level VSS is inputted into a source electrode of M4. The drain electrode of M2 is connected to an output end of AF1(O).

TG1(O) includes: a fifth transistor M5 and a sixth transistor M6. A gate electrode of the fifth transistor M5 is connected to the first clock signal input end for inputting the first clock signal CLK, and a gate electrode of the sixth transistor M6 is connected to the second clock signal input end for inputting the second clock signal CLKB. M5 is a P-type transistor, and M6 is an N-type transistor.

A source electrode of M5 is connected to a drain electrode of M6, and a drain electrode of M5 is connected to a source electrode of M6.

The source electrode of M5 is connected to an input end of TG1(0), and the drain electrode of M5 is connected to an output end of TG1(0).

TG2(O) includes a seventh transistor M7 and an eighth transistor M8. M7 is a P-type transistor, and M8 is an N-type transistor. Inv(O) includes a ninth transistor M9 and a tenth transistor M10. A gate electrode of the ninth transistor M9 and a gate electrode of the tenth transistor M10 are both connected to an input end of Inv(O).

A source electrode of M9 is connected to a high level VDD, a source electrode of M10 is connected to a low level VSS, and a drain electrode of M9 is connected to a drain electrode of M10. The drain electrode of M9 is connected to an output end of Inv(O) and the carry end SC. M9 is a P-type transistor, and M10 is an N-type transistor.

AF2(O) includes an eleventh transistor M11, a twelfth transistor M12, a thirteenth transistor M13 and a fourteenth transistor M14. A gate electrode of M11 and a gate electrode of M14 are both connected to the first clock signal input end for inputting first clock signal CLK, and a gate electrode of M12 and a gate electrode of M13 are both connected to the carry end SC.

M11 and M12 each is a P-type transistor, and M13 and M14 each is an N-type transistor.

A source electrode of M11 and a source electrode of M12 are both connected to a high level VDD, and a drain electrode of M11 and a drain electrode of M12 are both connected to the output end of AF2(O).

A drain electrode of M13 is connected to the output end of AF2(O); a drain electrode of M14 is connected to a source electrode of M13; and a source electrode of M14 is connected to the low level VSS.

A source electrode of M7 included in AF2(O) is connected to the output end of AF2(O). A drain electrode of M8 is connected to the source electrode of M7, a drain electrode of M7 is connected to the input end of Inv(O), and a source electrode of M8 is connected to the drain electrode of M7.

AND(O) includes a fifteenth transistor M15, a sixteenth transistor M16, a seventeenth transistor M17, an eighteenth transistor M18, a nineteenth transistor M19, and a twentieth transistor M20.

A gate electrode of M15 and a gate electrode of M18 are both connected to ENB(O), and a gate electrode of M16 and a gate electrode of M17 are both connected to SC(O). All of M15, M16 and M19 are P-type transistors, and M17, M18 and M20 are all N-type transistors.

A source electrode of M15 and a source electrode of M16 are connected to a high level VDD. A drain electrode of M15 and a drain electrode of M16 are both connected to a drain electrode of M17. A source electrode of M17 is connected to a drain electrode of M18, and a source electrode of M18 is connected to the low level VSS.

The drain electrode of M17 is connected to a gate electrode of M19 and a gate electrode of M20; a source electrode of M19 is connected to the high level VDD; a drain electrode of M19 is connected to a drain electrode of M20; and a source electrode of M20 is connected to the low level VSS. The drain electrode of M19 is connected to an output end of AND(O).

Buffer(O) includes a twenty-first transistor M21, a twenty-second transistor M22, a twenty-third transistor M23, and a twenty-fourth transistor M24. A gate electrode of M21 and a gate electrode of M22 are both connected to the input end of buffer(O). Both M21 and M23 are P-type transistors, and both M22 and M24 are N-type transistors. A source electrode of M21 and a source electrode of M23 are connected to a high level VDD; a drain electrode of M21 is connected to a gate electrode of M23 and a gate electrode of M24; the drain electrode of M21 is connected to a drain electrode of M22; a drain electrode of M23 is connected to a drain electrode of M24; a source electrode of M22 and a source electrode of M24 are both connected to the low level VSS; and the drain electrode of M23 is connected to an output end of buffer(O).

SC(O) is connected to INPUT(E).

AF1(E) includes a twenty-fifth transistor M25, a twenty-sixth transistor M26, a twenty-seventh transistor M27, and a twenty-eighth transistor M28.

A gate electrode of M25 and a gate electrode of M27 are both connected to the first clock signal input end for inputting the first clock signal CLK. A gate electrode of M26 and a gate electrode of M28 are connected to INPUT(E). Both M25 and M26 are N-type transistors, and M27 and M28 are both P-type transistors. A drain electrode of M25 is connected to a low level VSS, and a drain electrode of M26 is connected to a source electrode of M25. A source electrode of M27 and a source electrode of M28 are both connected to the drain electrode of M26, and a drain electrode of M27 and a drain electrode of M28 are connected to a high level VDD. The source electrode of the M26 is connected to the output end of AF1(E).

TG2(E) includes a twenty-ninth transistor M29 and a thirtieth transistor M30, M29 is an N-type transistor, and M30 is a P-type transistor.

TG1(E) includes a thirty-first transistor M31 and a thirty-second transistor M32.

A gate electrode of M31 is connected to a first clock signal input end for inputting the first clock signal CLK, and a gate electrode of M32 is connected to a second clock signal input end for inputting the second clock signal CLKB. M31 is an N-type transistor, and M32 is a P-type transistor. A drain electrode of M31 is connected to a source electrode of M32, and a source electrode of M31 is connected to a drain electrode of M32. The drain electrode of M31 is connected to an input end of TG1(E), and the source electrode of M31 is connected to an output end of TG1(E).

Inv(E) includes a thirty-third transistor M33 and a thirty-fourth transistor M34. A gate electrode of the thirty-third transistor M33 and a gate electrode of the thirty-fourth transistor M34 are both connected to an input end of Inv(E). A drain electrode of M33 is connected to the low level VSS, a drain electrode of M34 is connected to the high level VDD, and a source electrode of M33 is connected to both the drain electrode of M34. The source electrode of M33 is connected to an output end of Inv(E) and SC(E). M33 is an N-type transistor, and M34 is a P-type transistor.

AF2(E) includes a thirty-fifth transistor M35, a thirty-sixth transistor M36, a thirty-seventh transistor M37 and a thirty-eighth transistor M38.

A gate electrode of M35 and a gate electrode of M37 are both connected to the second clock signal input end for inputting the second clock signal CLKB, and a gate electrode of M36 and a gate electrode of M38 are both connected to SC(E). Both M35 and M36 are N-type transistors, and M37 and M38 are both P-type transistors. A drain electrode of M37 and a drain electrode of M38 are connected to the high level VDD, and a source electrode of M37 and a source electrode of M38 are both connected to an output end of AF2(E). A source electrode of M35 is connected to the output end of AF2(E); a drain electrode of M36 is connected to the source electrode of M35, a source electrode of M36 is connected to a source electrode of M37; and the drain electrode of M29 of TG2(E) is connected to an output end of AF2(E). A source electrode of M30 is connected to the drain electrode of M29, the source electrode of M29 is connected to an input end of Inv(E), and the drain electrode of M30 is connected to the source electrode of M29.

AND(E) includes a thirty-nine transistor M39, a fortieth transistor M40, a forty-first transistor M41, a forty-second transistor M42, a forty-third transistor M43, and a forty-fourth transistor M44. A gate electrode of M39 and a gate electrode of M41 are both connected to ENB(E), and a gate electrode of M40 and a gate electrode of M42 are connected to SC(E). M39, M40 and M43 are N-type transistors, and M41, M42 and M44 are P-type transistors.

A drain electrode of M41 and a drain electrode of M42 are connected to the high level VDD. A source electrode of M41 and a source electrode of M42 are both connected to a source electrode of M40. A source electrode of M39 is connected to a drain electrode of M40, and a drain electrode of M39 is connected to the low level VSS. A source electrode of M40 is connected to a gate electrode of M43 and a gate electrode of M44; a drain electrode of M43 is connected to the low level VSS; a source electrode of M43 is connected to a source electrode of M44; and a drain electrode of M44 is connected to the high level VDD. The source electrode of M43 is connected to an output end of the AND(E).

Buffer(E) includes a forty-fifth transistor M45, a forty-sixth transistor M46, a forty-seventh transistor M47, and a forty-eighth transistor M48. A gate electrode of M45 and a gate electrode of M46 are connected to an input end of Buffer(E). Both M15 and M47 are N-type transistors, and both M46 and M48 are P-type transistors. A drain electrode of M45 and a drain electrode of M47 are both connected to the low level VSS; a source electrode of M45 is connected to a gate electrode of M47 and a gate electrode of M48; the source electrode of M45 is also connected to a source electrode of M46; a source electrode of M47 is a source electrode of M48; and the drain electrode of M46 and the drain electrode of M48 are connected to the high level VDD. The source electrode of M47 is connected to an output end of Buffer(E).

A method for driving a gate driving unit is provided according to an embodiment of the present disclosure, which is used to drive above-mentioned gate driving unit. The method for driving a gate driving unit comprises:

delaying, by the shift register circuit, the phase of the input signal inputted by the signal input end under control of the first clock signal input end and the second clock signal input end to obtain the carry signal, and outputting the carry signal through the carry end; and regulating, by the pulse width regulation circuit, the pulse width of the carry signal under control of the enable end to obtain the gate drive signal, and outputting the gate drive signal through the gate drive signal output end.

In the method for driving a gate driving unit according to the embodiment of the present disclosure, signal phase delay and pulse width regulation are respectively achieved by the shift register circuit and the pulse width regulation circuit, and the gate driving unit has a simple structure and a small number of components, which may achieve a narrow bezel design and meet requirements on low power consumption.

Specifically, the gate driving unit may further include a buffer circuit, and the method for driving the gate driving unit comprises: buffering, by the buffer circuit, the gate drive signal to filter a glitch signal out of the gate drive signal, to obtain the carry signal; and outputting the gate drive signal as buffered through the gate drive signal output end.

In a specific implementation, the delaying, by the shift register circuit, the phase of the input signal inputted by the signal input end under control of the first clock signal input end and the second clock signal input end to obtain the carry signal, and outputting the carry signal through the carry end further includes: during a driving period, in a first stage, inputting a first level into the first clock signal input end, inputting a second level into the second clock signal input end, and inputting the first level into the signal input end, in such a manner that a first transmission gate is turned off, a second NAND gate outputs the first level, and a second transmission gate is turned on, so as to write the first level outputted by the second NAND gate into an input end of a phase inverter, to enable the phase inverter to output the second level to the carry end, and to maintain a potential of the carry end at the second level, wherein an initial potential of the carry end is at the second level;

in a second stage, inputting the second level into the first clock signal input end, inputting the first level into the second clock signal input end, and inputting the first level into the signal input end, in such a manner that a first NAND gate outputs the second level, the first transmission gate is turned on, the second level is inputted into an input end of a phase inverter, the phase inverter outputs the first level to the carry end, and the second transmission gate is turned off, so as to enable the potential of the carry end to be at the first level;

in a third stage, inputting the first level into the first clock signal input end, inputting the second level into the second clock signal input end, and inputting the second level into the signal input end, in such a manner that the first transmission gate is turned off, the second NAND gate outputs the second level, the second transmission gate is turned on, the second level is inputted into the input end of the phase inverter, and the phase inverter outputs the first level to the carry end, so as to maintain the potential of the carry end at the first level; and in a fourth stage, inputting the second level into the first clock signal input end, inputting the first level into the second clock signal input end, and inputting the second level into the signal input end, in such a manner that the first NAND gate outputs the first level, the first transmission gate is turned on, the first level is inputted into the input end of the phase inverter, the phase inverter outputs the second level to the carry end, and the second transmission gate is turned off, so as to maintain the potential of the carry end at the second level.

In this embodiment, the first level is higher than the second level.

In actual operation, the first level may be a high level, and the second level may be a low level; or the first level may be a low level, and the second level may be a high level. How to select the first level and the second level is related to types of transistors used in each logic circuit, which are not limited herein.

In a specific implementation, the regulating, by the pulse width regulation circuit, the pulse width of the carry signal under control of the enable end to obtain the gate drive signal, and outputting the gate drive signal through the gate drive signal output end comprises:

in the first stage, inputting the second level into the enable end, and enabling a potential of the gate drive signal outputted by an AND gate to be the second level, wherein the potential of the carry end is the second level;

in the second stage, wherein the potential of the carry end is the first level, and the second stage includes a first time period, a second time period, and a third time period that are sequentially set, in the first time period and the third time period, inputting the second level into the enable end, and enabling the potential of the gate drive signal outputted by the AND gate to be the second level; and in the second time period, inputting the first level into enable end, and enabling the potential of the gate drive signal outputted by the AND gate to be the first level, wherein the carry end outputs the first level;

in the third stage, inputting the second level into the enable end, and enabling the potential of the gate drive signal outputted by the AND gate to be the second level, wherein the carry end outputs the first level; and in the fourth stage, enabling the potential of the gate drive signal outputted by the AND gate to be the second level, wherein the carry end outputs the second level.

In the embodiment, the first level is higher than the second level, that is, the first level is a high level, and the second level is a low level.

A gate driving circuitry is provided according to an embodiment of the present disclosure, which includes a plurality of cascaded gate driving units as described above. Except a first stage of the gate driving units, a signal input end of each stage of the gate driving units is connected to a carry end of an adjacent upper stage of the gate driving units. A positive phase clock signal is inputted into each of first clock signal input ends of odd-numbered stages of the gate driving units, and an inverted phase clock signal is inputted into each of second clock signal input ends of the odd-numbered stages of the gate driving units. The inverted phase clock signal is inputted into each of first clock signal input ends of even-numbered stages of the gate driving units, and the positive phase clock signal is inputted into each of second clock signal input ends of the even-numbered stages of the gate driving units.

A phase of the positive phase clock signal and a phase of the inverted clock signal are mutually inverted.

A display module is provided according to an embodiment of the present disclosure, which includes the above-described gate driving circuitry.

According to the embodiment of the present disclosure, the display module may be applied to, for example, a wearable device.

According to the embodiments of the present disclosure, a design about the gate driving circuitry applied to a wearable device is provided, a logic gate circuit is formed by TFTs that are fabricated on a glass substrate based on a LTPS process, and various logic gate circuits are used to respectively construct the shift register module, the pulse width regulation circuit, and the buffer circuit, so as to achieve signal phase delay, pulse width regulation, and buffering functions, respectively. Finally, various modules are cascaded with each other to form the gate driving circuitry. The whole circuitry has a simple structure and a small number of transistors, which may achieve a narrow bezel design and meet requirements on low power consumption.

The foregoing are optional embodiments of the present disclosure. It should be noted that persons of ordinary skill in the art can also make numerous improvements and polishments without departing from the principle of the present disclosure, and these improvements and polishments shall fall within the protection scope of the present disclosure.

What is claimed is:

1. A gate driving unit, comprising:
    a shift register circuit, directly connected to a signal input end, a first clock signal input end, a second clock signal input end and a carry end, and configured to delay a phase of an input signal inputted by the signal input end under control of the first clock signal input end and the second clock signal input end to obtain a carry signal, and output the carry signal through the carry end; and
    a pulse width regulation circuit, directly connected to the carry end, an enable end and a gate drive signal output end, and configured to regulate a pulse width of the carry signal under control of the enable end to obtain a gate drive signal, and output the gate drive signal through the gate drive signal output end;
    wherein the shift register circuit comprises a first NAND gate, a first transmission gate, a phase inverter, a second NAND gate, and a second transmission gate, wherein
    a first input end of the first NAND gate is directly connected to the signal input end, and a second input end of the first NAND gate is directly connected to the second clock signal input end;
    a positive phase control end of the first transmission gate is directly connected to the second clock signal input end, an inverted phase control end of the first transmission gate is directly connected to the first clock signal input end, and an input end of the first transmission gate is directly connected to an output end of the first NAND gate;
    an input end of the phase inverter is directly connected to an output end of the first transmission gate, and an output end of the phase inverter is directly connected to the carry end;
    a first input end of the second NAND gate is directly connected to the first clock signal input end, and a second input end of the second NAND gate is directly connected to the carry end; and
    a positive phase control end of the second transmission gate is directly connected to the first clock signal input end, an inverted phase control end of the second transmission gate is directly connected to the second clock signal input end, an input end of the second transmission gate is directly connected to the output end of the second NAND gate, and an output end of the second transmission gate is directly connected to the input end of the phase inverter.

2. The gate driving unit according to claim 1, further comprising a buffer circuit, wherein the buffer circuit is directly connected between the pulse width regulation circuit and the gate drive signal output end, and is configured to buffer the gate drive signal to filter a glitch signal out of the gate drive signal to obtain the buffered gate drive signal, and output the buffered gate drive signal through the gate drive signal output end.

3. The gate driving unit according to claim 2, wherein the pulse width regulation circuit comprises an AND gate, a first input end of the AND gate is directly connected to the carry end, a second input end of the AND gate is connected to the enable end, and an output end of the AND gate is directly connected to the gate drive signal output end through the buffer circuit.

4. The gate driving unit according to claim 3, wherein the AND gate consists of an N-type transistor and a P-type transistor.

5. The gate driving unit according to claim 3, wherein the buffer circuit comprises a buffer having an input end directly connected to the output end of the AND gate, and an output end directly connected to the gate drive signal output end.

6. The gate driving unit according to claim 5, wherein the buffer consists of an N-type transistor and a P-type transistor.

7. The gate driving unit according to claim 1, wherein each of the first NAND gate, the first transmission gate, the phase inverter, the second NAND gate, and the second transmission gate consists of an N-type transistor and a P-type transistor.

8. A method for driving the gate driving unit according to claim 1, the method for driving the gate driving unit comprising:
    delaying, by the shift register circuit, the phase of the input signal inputted by the signal input end under control of the first clock signal input end and the second clock signal input end to obtain the carry signal, and outputting the carry signal through the carry end; and
    regulating, by the pulse width regulation circuit, the pulse width of the carry signal under control of the enable end to obtain the gate drive signal, and outputting the gate drive signal through the gate drive signal output end.

9. The method according to claim 8, wherein the gate driving unit further comprises a buffer circuit, and the method for driving the gate driving unit comprising:
    buffering, by the buffer circuit, the gate drive signal to filter a glitch signal out of the gate drive signal, to obtain the carry signal; and outputting the gate drive signal as buffered through the gate drive signal output end.

10. The method according to claim 8, wherein the delaying, by the shift register circuit, the phase of the input signal inputted by the signal input end under control of the first clock signal input end and the second clock signal input end to obtain the carry signal, and outputting the carry signal through the carry end specifically includes: during a driving period,
in a first stage, inputting a first level into the first clock signal input end, inputting a second level into the second clock signal input end, and inputting the first level into the signal input end, in such a manner that a first transmission gate is turned off, a second NAND gate outputs the first level, and a second transmission gate is turned on, so as to write the first level outputted by the second NAND gate into an input end of a phase inverter, to enable the phase inverter to output the second level to the carry end, and to maintain a potential of the carry end at the second level, wherein an initial potential of the carry end is at the second level;
in a second stage, inputting the second level into the first clock signal input end, inputting the first level into the second clock signal input end, and inputting the first level into the signal input end, in such a manner that a first NAND gate outputs the second level, the first transmission gate is turned on, the second level is inputted into an input end of a phase inverter, the phase inverter outputs the first level to the carry end, and the second transmission gate is turned off, so as to enable the potential of the carry end to be at the first level;
in a third stage, inputting the first level into the first clock signal input end, inputting the second level into the second clock signal input end, and inputting the second level into the signal input end, in such a manner that the first transmission gate is turned off, the second NAND gate outputs the second level, the second transmission gate is turned on, the second level is inputted into the input end of the phase inverter, and the phase inverter outputs the first level to the carry end, so as to maintain the potential of the carry end at the first level; and
in a fourth stage, inputting the second level into the first clock signal input end, inputting the first level into the second clock signal input end, and inputting the second level into the signal input end, in such a manner that the first NAND gate outputs the first level, the first transmission gate is turned on, the first level is inputted into the input end of the phase inverter, the phase inverter outputs the second level to the carry end, and the second transmission gate is turned off, so as to maintain the potential of the carry end at the second level.

11. The method according to claim 10, wherein the regulating, by the pulse width regulation circuit, the pulse width of the carry signal under control of the enable end to obtain the gate drive signal, and outputting the gate drive signal through the gate drive signal output end comprises:
in the first stage, inputting the second level into the enable end, and enabling a potential of the gate drive signal outputted by an AND gate to be the second level, wherein the potential of the carry end is the second level;
in the second stage, wherein the potential of the carry end is the first level, and the second stage includes a first time period, a second time period, and a third time period that are sequentially set, in the first time period and the third time period, inputting the second level into the enable end, and enabling the potential of the gate drive signal outputted by the AND gate to be the second level; and in the second time period, inputting the first level into enable end, and enabling the potential of the gate drive signal outputted by the AND gate to be the first level, wherein the carry end outputs the first level;
in the third stage, inputting the second level into the enable end, and enabling the potential of the gate drive signal outputted by the AND gate to be the second level, wherein the carry end outputs the first level; and
in the fourth stage, enabling the potential of the gate drive signal outputted by the AND gate to be the second level, wherein the carry end outputs the second level.

12. A gate driving circuitry comprising a plurality of cascaded gate driving units according to claim 1,
wherein except a first stage of the gate driving units, a signal input end of each stage of the gate driving units is connected to a carry end of an adjacent upper stage of the gate driving units;
a positive phase clock signal is inputted into each of first clock signal input ends of odd-numbered stages of the gate driving units, and an inverted phase clock signal is inputted into each of second clock signal input ends of the odd-numbered stages of the gate driving units; and
the inverted phase clock signal is inputted into each of first clock signal input ends of even-numbered stages of the gate driving units, and the positive phase clock signal is inputted into each of second clock signal input ends of the even-numbered stages of the gate driving units.

13. A display module, comprising the gate driving circuitry according to claim 12.

14. The display module according to claim 13, wherein the display module is applied to a wearable device.

15. The gate driving circuitry according to claim 12, wherein each of gate driving units further comprises a buffer circuit, wherein the buffer circuit is directly connected between the pulse width regulation circuit and the gate drive signal output end, and is configured to buffer the gate drive signal to filter a glitch signal out of the gate drive signal to obtain the buffered gate drive signal, and output the buffered gate drive signal through the gate drive signal output end.

16. The gate driving circuitry according to claim 15, wherein the pulse width regulation circuit comprises an AND gate, a first input end of the AND gate is directly connected to the carry end, a second input end of the AND gate is directly connected to the enable end, and an output end of the AND gate is directly connected to the gate drive signal output end through the buffer circuit.

17. The gate driving circuitry according to claim 16, wherein the AND gate consists of an N-type transistor and a P-type transistor,
wherein the buffer circuit comprises a buffer having an input end directly connected to the output end of the AND gate, and an output end directly connected to the gate drive signal output end, wherein the buffer consists of an N-type transistor and a P-type transistor.

18. The gate driving circuitry according to claim 12, wherein each of the first NAND gate, the first transmission gate, the phase inverter, the second NAND gate, and the second transmission gate consists of an N-type transistor and a P-type transistor.

* * * * *